United States Patent
Zhang et al.

(10) Patent No.: US 11,237,604 B2
(45) Date of Patent: Feb. 1, 2022

(54) SYSTEMS AND METHODS FOR SHARING OF AIRFLOW BETWEEN ADJACENT INFORMATION HANDLING RESOURCE MODULES

(71) Applicant: Dell Products L.P., Round Rock, TX (US)

(72) Inventors: Mingming Zhang, Shanghai (CN); Qingqiang Guo, Shanghai (CN); Weidong Zuo, Shrewsbury, MA (US); Zhiwen Jiang, Shanghai (CN)

(73) Assignee: Dell Products L.P., Round Rock, TX (US)

(*) Notice: Subject to any disclaimer, the term of this patent is extended or adjusted under 35 U.S.C. 154(b) by 53 days.

(21) Appl. No.: 16/909,301

(22) Filed: Jun. 23, 2020

(65) Prior Publication Data
US 2021/0389811 A1   Dec. 16, 2021

(30) Foreign Application Priority Data
Jun. 15, 2020   (CN) .......................... 202010541747.3

(51) Int. Cl.
*G06F 1/20* (2006.01)
*G06F 1/18* (2006.01)
*H05K 7/20* (2006.01)

(52) U.S. Cl.
CPC .............. *G06F 1/20* (2013.01); *G06F 1/181* (2013.01); *H05K 7/20145* (2013.01); *G06F 2200/201* (2013.01)

(58) Field of Classification Search
CPC . G06F 1/20; G06F 1/181; G06F 1/187; G06F 1/206; G06F 2200/201; G06F 1/183; H05K 7/20736; H05K 7/20727; H05K 7/20145; H05K 7/20836; H05K 7/1489; H05K 7/20009; H05K 7/20709; H05K 1/0203; H05K 7/20136; H05K 7/20718; H05K 7/20563; H05K 7/2049; H05K 7/20818; H05K 7/20; G11B 33/128; G11B 33/142
USPC ..... 361/695, 679.48, 690, 694, 727, 679.49, 361/679.5, 679.46, 752, 692, 679.02, 678, 361/679.01; 454/184; 165/104.33, 80.3, 165/80.2
See application file for complete search history.

(56) References Cited

U.S. PATENT DOCUMENTS 10,299,410 B1 *  5/2019  Patrick ............... H05K 7/20736
10,470,340 B2 * 11/2019  Skoglund ............ H05K 5/0213

* cited by examiner

*Primary Examiner* — Mandeep S Buttar
(74) *Attorney, Agent, or Firm* — Jackson Walker L.L.P.

(57) ABSTRACT

An adaptive airflow flapper assembly may be configured to when present in a first chassis bay adjacent to a second chassis bay unpopulated with a another information handling resource module, close to a closed position relative to the enclosure such that, due to non-overlap of the enclosure airflow openings relative to the flapper airflow openings, the adaptive airflow flapper assembly prevents airflow between the interior and the exterior of an enclosure, and when present in the first chassis bay adjacent to the second chassis bay populated with the second information handling resource module, open to an open position relative to the enclosure to allow airflow between the interior and the exterior of the enclosure.

15 Claims, 5 Drawing Sheets

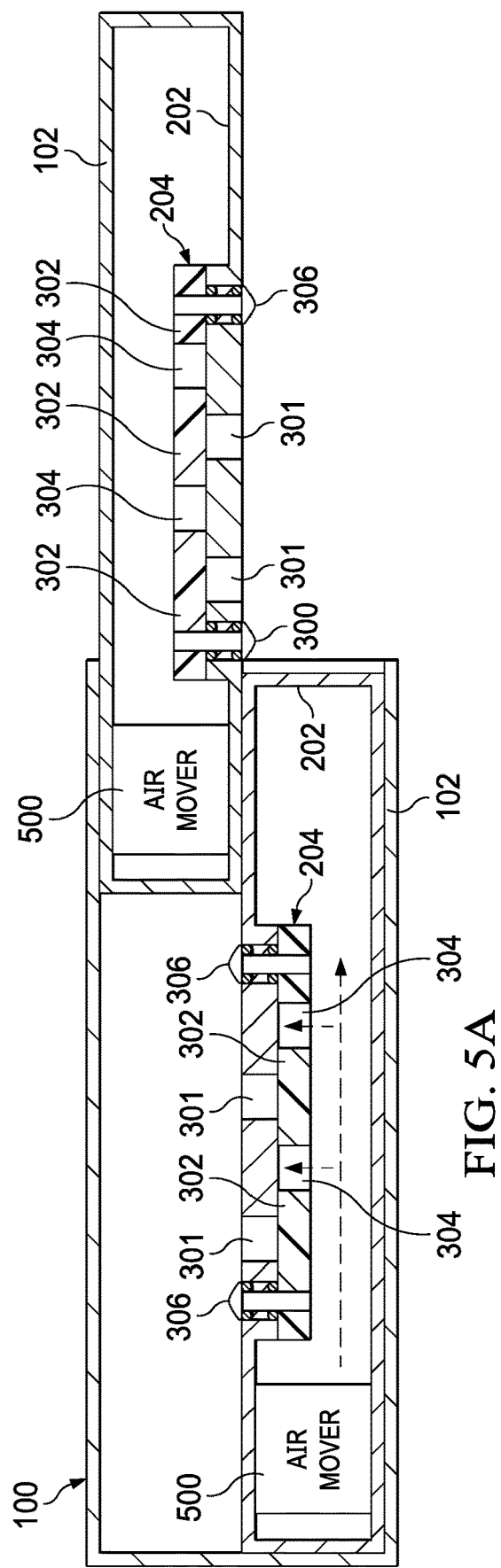
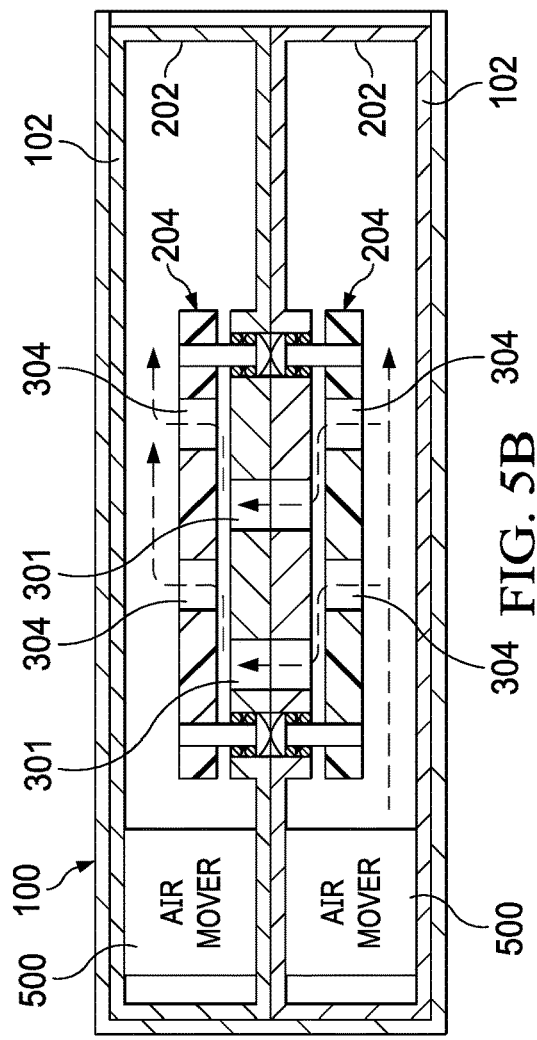
FIG. 5A
FIG. 5B

SYSTEMS AND METHODS FOR SHARING OF AIRFLOW BETWEEN ADJACENT INFORMATION HANDLING RESOURCE MODULES

TECHNICAL FIELD

The present disclosure relates to modular information handling systems. More specifically, embodiments of the disclosure provide systems and methods for sharing of airflow between adjacent information handling resource modules while preventing circulation of air into a chassis bay unpopulated with an information handling resource.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis. In traditional modular systems, information handling resources (including hard disk drives) and their corresponding chassis bays are typically accessed from a side of the chassis in which the information handling resources may be added or removed.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

Often, air movers are used in a redundant configuration in information handling systems, wherein a plurality of air movers are installed, configured, and arranged such that in case of a fault of one air mover, the remaining air movers may be sufficient to meet the cooling needs of the information handling system. However, during an air mover fault, some components in the airflow path of the faulted air mover may not be sufficiently cooled in the absence of air redirection from other non-faulted air movers.

SUMMARY

In accordance with the teachings of the present disclosure, the disadvantages and problems associated with cooling of information handling resources in a chassis have been substantially reduced or eliminated.

In accordance with embodiments of the present disclosure, an information handling system may include a chassis comprising a plurality of chassis bays, each chassis bay configured to receive a corresponding information handling resource module and a first information handling resource module inserted into a first chassis bay of the plurality of chassis bays. The first information handling resource module comprising an enclosure for housing components of the first information handling resource module, the enclosure having formed therein a plurality of enclosure airflow openings for allowing airflow between an interior and an exterior of the enclosure and an adaptive airflow flapper assembly mechanically coupled to the enclosure, the adaptive airflow flapper assembly comprising a flapper having formed therein a plurality of flapper airflow openings for allowing airflow between the flapper airflow openings. The adaptive airflow flapper assembly may be configured to when present in the chassis adjacent to a second chassis bay unpopulated with a second information handling resource module, close to a closed position relative to the enclosure such that, due to non-overlap of the enclosure airflow openings relative to the flapper airflow openings, the adaptive airflow flapper assembly prevents airflow between the interior and the exterior of the enclosure, and when present in the chassis adjacent to the second chassis bay populated with the second information handling resource module, open to an open position relative to the enclosure to allow airflow between the interior and the exterior of the enclosure.

In accordance with these and other embodiments of the present disclosure, an information handling resource module configured to be inserted into one or more of a plurality of chassis bays of a chassis of an information handling system, the information handling resource module comprising an enclosure for housing components of the information handling resource module, the enclosure having formed therein a plurality of enclosure airflow openings for allowing airflow between an interior and an exterior of the enclosure and an adaptive airflow flapper assembly mechanically coupled to the enclosure, the adaptive airflow flapper assembly comprising a flapper having formed therein a plurality of flapper airflow openings for allowing airflow between the flapper airflow openings, the adaptive airflow flapper assembly configured to when present in a first chassis bay of the chassis adjacent to a second chassis bay unpopulated with a second information handling resource module, close to a closed position relative to the enclosure such that, due to non-overlap of the enclosure airflow openings relative to the flapper airflow openings, the adaptive airflow flapper assembly prevents airflow between the interior and the exterior of the enclosure and when present in the chassis adjacent to the second chassis bay populated with the second information handling resource module, open to an open position relative to the enclosure to allow airflow between the interior and the exterior of the enclosure.

In accordance with these and other embodiments of the present disclosure, a method may be provided for forming an information handling resource module configured to be inserted into one or more of a plurality of chassis bays of a chassis of an information handling system. The method may include mechanically coupling an adaptive airflow flapper assembly to an enclosure for housing components of the information handling resource module, the enclosure having formed therein a plurality of enclosure airflow openings for allowing airflow between an interior and an exterior of the enclosure. The adaptive airflow flapper assembly may comprise a flapper having formed therein a plurality of flapper airflow openings for allowing airflow between the flapper airflow openings, and wherein the adaptive airflow flapper assembly is coupled to the enclosure such that the adaptive airflow flapper assembly is configured to, when present in a first chassis bay of the chassis adjacent to a second chassis bay unpopulated with a second information handling resource module, close to a closed position relative to the enclosure such that, due to non-overlap of the enclosure airflow openings relative to the flapper airflow openings, the adaptive airflow flapper assembly prevents airflow between the interior and the exterior of the enclosure, and when present in the chassis adjacent to the second chassis bay populated with the second information handling resource module, open to an open position relative to the enclosure to allow airflow between the interior and the exterior of the enclosure.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 5A illustrates a side cross-sectional view of an example chassis for receiving modular information handling resources and selected components of information handling resources including one information handling resource fully inserted into the chassis and an adjacent information handling resource only partially inserted into the chassis, in accordance with embodiments of the present disclosure; and FIG. 5B illustrates a side cross-sectional view of an example chassis for receiving modular information handling resources and selected components of information handling resources including two adjacent information handling resources fully inserted into the chassis, in accordance with embodiments of the present disclosure.

DETAILED DESCRIPTION

Preferred embodiments and their advantages are best understood by reference to FIGS. 1 through 5B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

In this disclosure, the term "information handling resource" may broadly refer to any component system, device or apparatus of an information handling system, including without limitation processors, buses, memories, input-output devices and/or interfaces, storage resources, network interfaces, motherboards, electro-mechanical devices (e.g., fans), displays, and power supplies.

Figure 1:
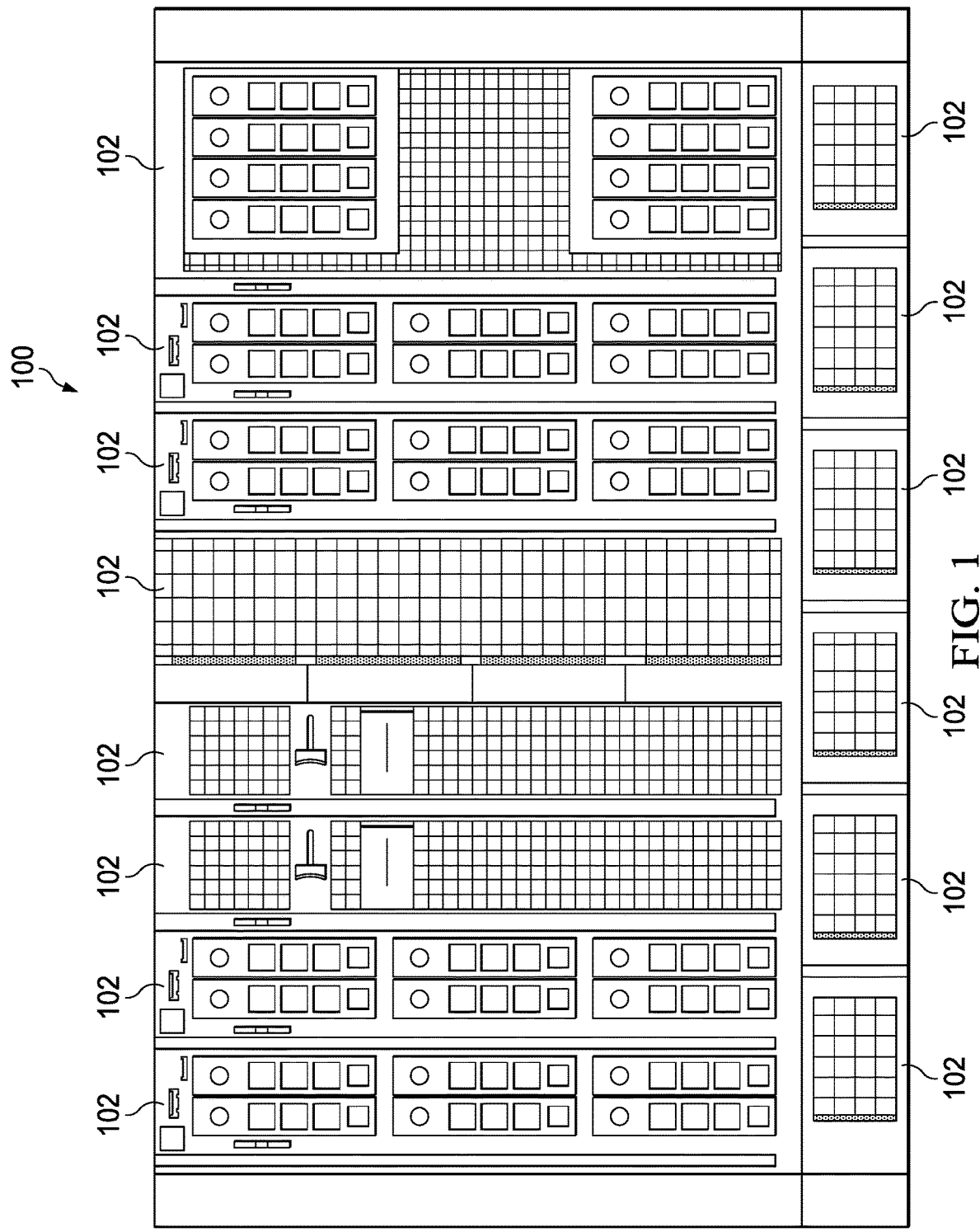
FIG. 1 illustrates a front view of an example chassis for receiving modular information handling resources, in accordance with embodiments of the present disclosure.

FIG. 1 illustrates a front view of an example chassis 100 for receiving modular information handling resources, in accordance with embodiments of the present disclosure. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more chassis bays for receiving information handling resources 102, as described in greater detail below.

Figure 2:
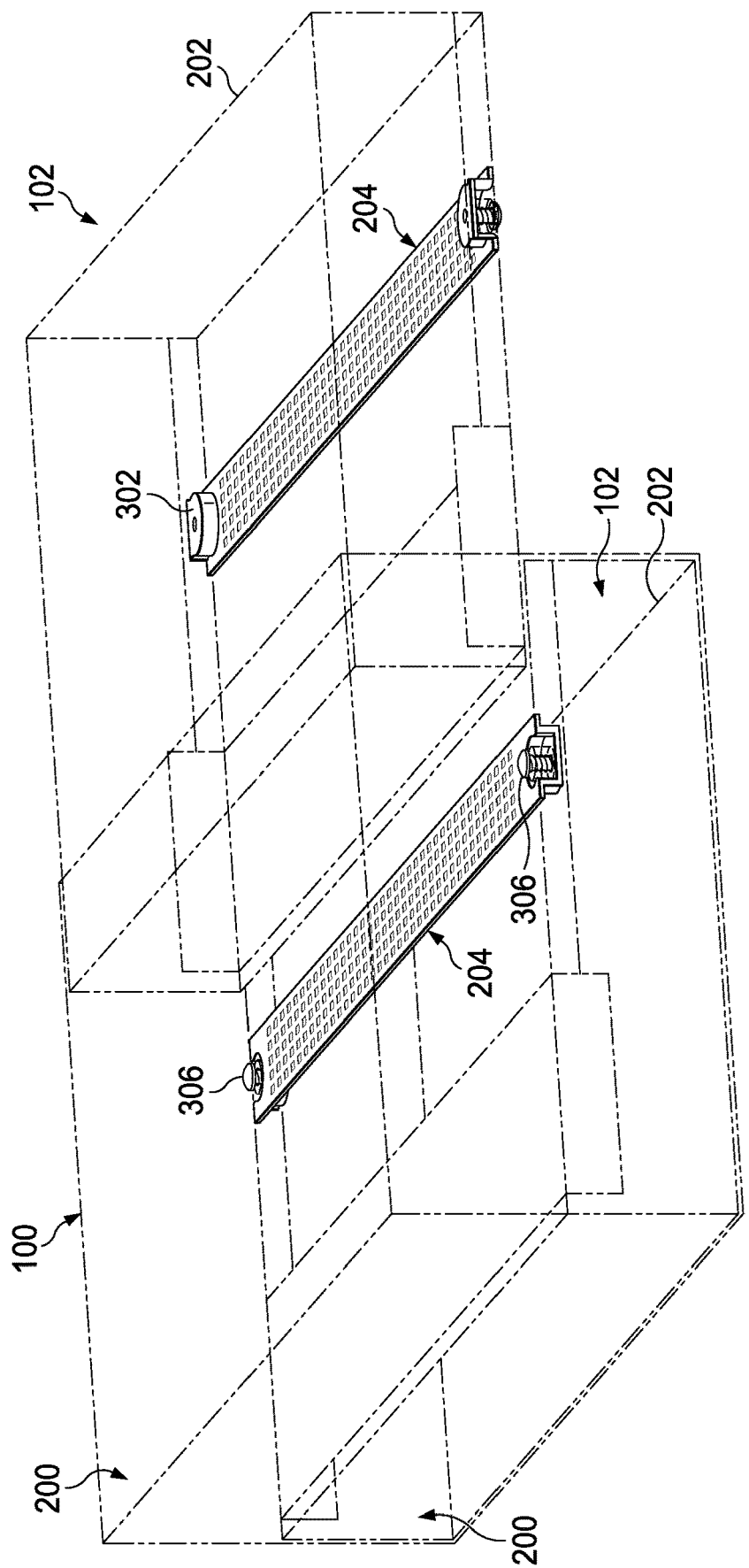
FIG. 2 illustrates a perspective view of selected components of an example chassis for receiving modular information handling resources and selected components of information handling resources that may be inserted into the chassis, in accordance with embodiments of the present disclosure.

FIG. 2 illustrates a perspective view of selected components of example chassis 100 and selected components of information handling resources 102 that may be inserted into chassis 100, in accordance with embodiments of the present disclosure. For purposes of exposition, some components of chassis 100 and information handling resources 102 may be depicted as being transparent, despite the fact such components may be optically opaque in actual implementation. As shown in FIG. 2, chassis 100 may include a plurality of chassis bays 200, each chassis bay 200 configured to receive a corresponding information handling resource 102. Each information handling resource 102 may comprise an enclosure 202, with an adaptive airflow flapper assembly 204 mechanically coupled thereto, the adaptive airflow flapper assembly 204 including a flapper 302 mechanically coupled to its associated enclosure 202 via a plurality of spring bolts 306.

Figure 3:
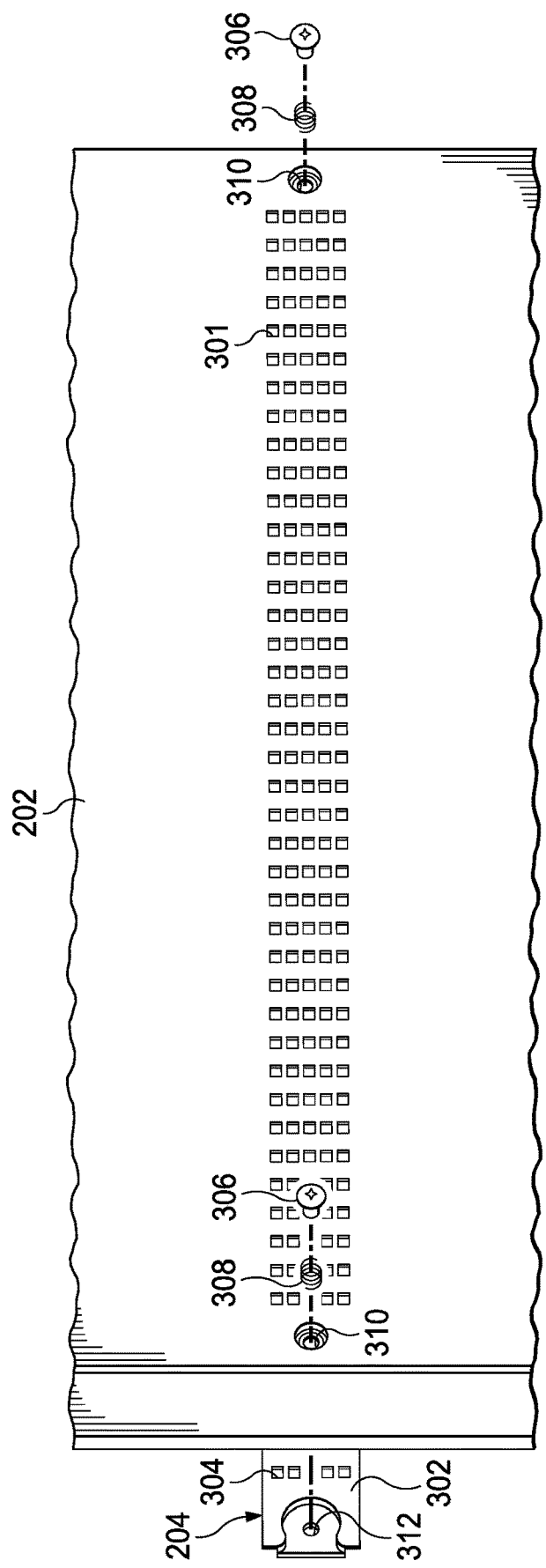
FIG. 3 illustrates a partially exploded bottom plan view of a portion of an enclosure of an information handling resource, in accordance with embodiments of the present disclosure.

FIG. 3 illustrates a partially exploded bottom plan view of a portion of an enclosure 202 of an information handling resource 102, in accordance with embodiments of the present disclosure. As shown in FIG. 3, enclosure 202 may comprise a plurality of airflow openings 301 formed therein. Flapper 302 may also include a plurality of airflow openings 304 formed therein such that when flapper 302 is in a closed position with respect to enclosure 202 (e.g., in physical contact with enclosure 202), airflow openings 301 and airflow openings 304 are non-overlapping, such that in such closed position, no significant airflow is able pass through airflow openings 301 and airflow openings 304.

As also depicted in FIG. 3, flapper 302 may be mechanically coupled to enclosure 202 via a plurality of spring bolts 306. Also as shown in FIG. 3, a spring bolt 306 may be coupled to a corresponding feature 312 of flapper 302 via a hole 310 formed in enclosure 202. Adaptive airflow flapper assembly 204 may also include, corresponding to each spring bolt 306, a spring 308 having a spring force that, in the absence of another force overcoming the spring force, may bias flapper 302 in the closed position relative to enclosure 202.

Figure 4:
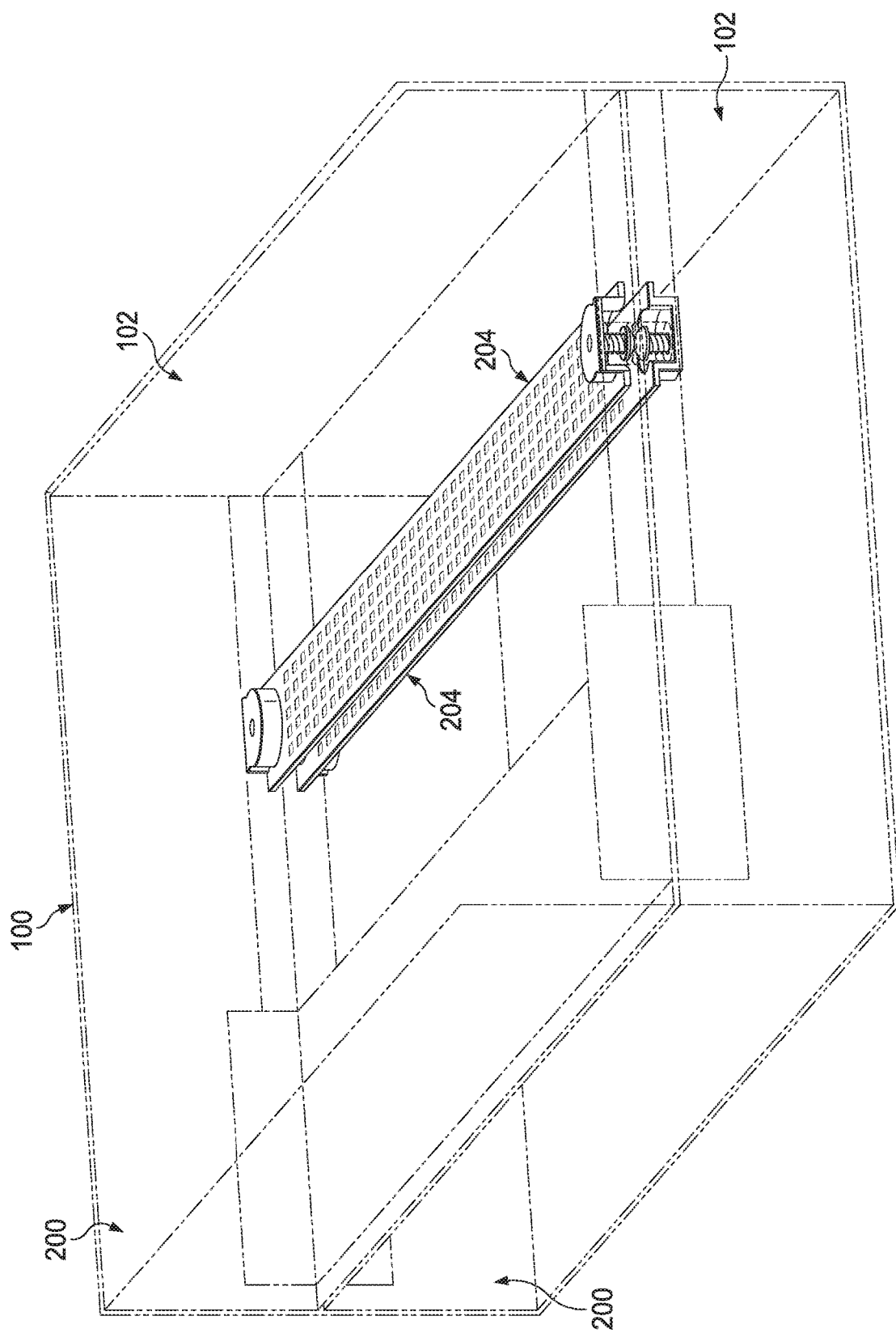
FIG. 4 illustrates a perspective view of selected components of an example chassis for receiving modular information handling resources and selected components of information handling resources fully inserted into the chassis, in accordance with embodiments of the present disclosure.

However, when a first information handling resource 102 is fully inserted into a first chassis bay 200 and a second information handling resource 102 is fully inserted into a second chassis bay 200 adjacent to the first chassis bay 200 as shown in FIG. 4, the enclosure 202 of the first information handling resource 102 may mechanically interact with the spring bolts 306 of the second information handling resource 102, causing flapper 302 of the second information handling resource 102 to move to an open position relative to enclosure 202 of the second information handling resource 102, and allowing airflow through the airflow openings 301 and airflow openings 304 of the second information handling resource 102. Likewise, the enclosure 202 of the second information handling resource 102 may mechanically interact with the spring bolts 306 of the first information handling resource 102, causing flapper 302 of the first information handling resource 102 to move to an open position relative to enclosure 202 of the first information handling resource 102, and allowing airflow through the airflow openings 301 and airflow openings 304 of the first information handling resource 102. Thus, assuming airflow openings 301 of the first information handling resource 102 and airflow openings 301 of the second information handling resource 102 are aligned, air may freely flow between the interiors of the enclosures 202 of the two adjacent information handling resources 102. This functionality is depicted in greater detail below with reference to FIGS. 5A and 5B.

FIG. 5A illustrates a side cross-sectional view of selected components of example chassis 100 for receiving modular information handling resources 102 and selected components of information handling resources 102 including a first information handling resource 102 fully inserted into a chassis bay 200 of chassis 100 and second information handling resource 102 only partially inserted into an adjacent chassis bay 200 of chassis 100, in accordance with embodiments of the present disclosure. Accordingly, as shown in FIG. 5A, spring forces of springs 308 (not shown in FIG. 5A) may bias flapper 302 of the first (bottom) information handling resource 102 in the closed position relative to enclosure 202 of the first (bottom) information handling resource 102, thus blocking any airflow driven by an air mover 500 of the first (bottom) information handling resource 102 from passing from the interior of enclosure 202 to the adjacent chassis bay 202 via airflow holes 301 and 304. Similarly, as shown in FIG. 5A, spring forces of springs 308 (not shown in FIG. 5A) may bias flapper 302 of the second (top) information handling resource 102 in the closed position relative to enclosure 202 of the second (top) information handling resource 102.

FIG. 5B illustrates a side cross-sectional view of selected components of example chassis 100 for receiving modular information handling resources 102 and selected components of information handling resources 102 including information handling resources 102 fully inserted into adjacent chassis bays 200 of chassis 100, in accordance with embodiments of the present disclosure. As shown in FIG. 5B, the enclosure 202 of the first (bottom) information handling resource 102 may mechanically interact with the spring bolts 306 of the second (top) information handling resource 102, causing flapper 302 of the second (top) information handling resource 102 to move to an open position relative to enclosure 202 of the second (top) information handling resource 102, and allowing airflow through the airflow openings 301 and airflow openings 304 of the second (top) information handling resource 102. Likewise, the enclosure 202 of the second (top) information handling resource 102 may mechanically interact with the spring bolts 306 of the first (bottom) information handling resource 102, causing flapper 302 of the first (bottom) information handling resource 102 to move to an open position relative to enclosure 202 of the first (bottom) information handling resource 102, and allowing airflow through the airflow openings 301 and airflow openings 304 of the first (bottom) information handling resource 102. Thus, assuming airflow openings 301 of the first (bottom) information handling resource 102 and airflow openings 301 of the second (top) information handling resource 102 are aligned, air may freely flow between the interiors of the enclosures 202 of the two adjacent information handling resources 102. As an example, FIG. 5B depicts direction of airflow in the event that an air mover 500 of the first (bottom) information handling resource 102 operates without fault and an air mover 500 of the second (top) information handling resource 102 is in a fault condition preventing it from generating airflow.

Accordingly, the adaptive airflow flapper assembly 204 described above provides for sharing of airflow between two adjacent information handling resources 102 inserted into chassis 100, while preventing airflow from escaping from an information handling resource 102 to an adjacent chassis bay 200 which is unpopulated with its own information handling resource 102.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system, comprising:
    a chassis comprising a plurality of chassis bays, each chassis bay configured to receive a corresponding information handling resource module; and
    a first information handling resource module inserted into a first chassis bay of the plurality of chassis bays, the first information handling resource module comprising:
        an enclosure for housing components of the first information handling resource module, the enclosure having formed therein a plurality of enclosure airflow openings for allowing airflow between an interior and an exterior of the enclosure; and
        an adaptive airflow flapper assembly mechanically coupled to the enclosure, the adaptive airflow flapper assembly comprising a flapper having formed therein a plurality of flapper airflow openings for allowing airflow between the flapper airflow openings, the adaptive airflow flapper assembly configured to:
            when present in the chassis adjacent to a second chassis bay unpopulated with a second information handling resource module, close to a closed position relative to the enclosure such that, due to non-overlap of the enclosure airflow openings relative to the flapper airflow openings, the adaptive airflow flapper assembly prevents airflow between the interior and the exterior of the enclosure; and
            when present in the chassis adjacent to the second chassis bay populated with the second information handling resource module, open to an open position relative to the enclosure to allow airflow between the interior and the exterior of the enclosure.

2. The information handling system of claim 1, wherein the adaptive airflow flapper assembly is further configured to, when removed from the chassis, open to the open position relative to the enclosure to allow airflow between the interior and the exterior of the enclosure.

3. The information handling system of claim 1, wherein the adaptive airflow flapper assembly further comprises:
    a plurality of spring bolts configured to mechanically couple the flapper to the enclosure;
    a plurality of springs, each spring mechanically coupled to a respective spring bolt and the enclosure, each spring having a spring force that biases the adaptive airflow flapper assembly in the closed position.

4. The information handling system of claim 3, wherein mechanical interaction of the spring bolt with the second information handling resource module when the second information handling resource module is populated in the second chassis bay causes the spring force to be overcome and causes the adaptive airflow flapper assembly to open to the open position.

5. The information handling system of claim 1, wherein the enclosure is configured to, when present in the chassis adjacent to the second chassis bay populated with the second information handling resource module, interact with a second adaptive airflow flapper assembly of the second information handling resource module to cause the second adaptive airflow flapper assembly to open to an open position allowing airflow between the respective interiors of the first information handling resource module and the second information handling resource module.

6. An information handling resource module configured to be inserted into one or more of a plurality of chassis bays of a chassis of an information handling system, the information handling resource module comprising:
    an enclosure for housing components of the information handling resource module, the enclosure having formed therein a plurality of enclosure airflow openings for allowing airflow between an interior and an exterior of the enclosure; and an adaptive airflow flapper assembly mechanically coupled to the enclosure, the adaptive airflow flapper assembly comprising a flapper having formed therein a plurality of flapper airflow openings for allowing airflow between the flapper airflow openings, the adaptive airflow flapper assembly configured to:
  when present in a first chassis bay of the chassis adjacent to a second chassis bay unpopulated with a second information handling resource module, close to a closed position relative to the enclosure such that, due to non-overlap of the enclosure airflow openings relative to the flapper airflow openings, the adaptive airflow flapper assembly prevents airflow between the interior and the exterior of the enclosure; and
  when present in the chassis adjacent to the second chassis bay populated with the second information handling resource module, open to an open position relative to the enclosure to allow airflow between the interior and the exterior of the enclosure.

7. The information handling resource module of claim 6, wherein the adaptive airflow flapper assembly is further configured to, when removed from the chassis, open to the open position relative to the enclosure to allow airflow between the interior and the exterior of the enclosure.

8. The information handling resource module of claim 6, wherein the adaptive airflow flapper assembly further comprises:
  a plurality of spring bolts configured to mechanically couple the flapper to the enclosure;
  a plurality of springs, each spring mechanically coupled to a respective spring bolt and the enclosure, each spring having a spring force that biases the adaptive airflow flapper assembly in the closed position.

9. The information handling resource module of claim 8, wherein mechanical interaction of the spring bolt with the second information handling resource module when the second information handling resource module is populated in the second chassis bay causes the spring force to be overcome and causes the adaptive airflow flapper assembly to open to the open position.

10. The information handling resource module of claim 6, wherein the enclosure is configured to, when present in the chassis adjacent to the second chassis bay populated with the second information handling resource module, interact with a second adaptive airflow flapper assembly of the second information handling resource module to cause the second adaptive airflow flapper assembly to open to an open position allowing airflow between the respective interiors of the first information handling resource module and the second information handling resource module.

11. A method for forming an information handling resource module configured to be inserted into one or more of a plurality of chassis bays of a chassis of an information handling system, the method comprising:
  mechanically coupling an adaptive airflow flapper assembly to an enclosure for housing components of the information handling resource module, the enclosure having formed therein a plurality of enclosure airflow openings for allowing airflow between an interior and an exterior of the enclosure;
  wherein the adaptive airflow flapper assembly comprises a flapper having formed therein a plurality of flapper airflow openings for allowing airflow between the flapper airflow openings, and wherein the adaptive airflow flapper assembly is coupled to the enclosure such that the adaptive airflow flapper assembly is configured to:
    when present in a first chassis bay of the chassis adjacent to a second chassis bay unpopulated with a second information handling resource module, close to a closed position relative to the enclosure such that, due to non-overlap of the enclosure airflow openings relative to the flapper airflow openings, the adaptive airflow flapper assembly prevents airflow between the interior and the exterior of the enclosure; and
    when present in the chassis adjacent to the second chassis bay populated with the second information handling resource module, open to an open position relative to the enclosure to allow airflow between the interior and the exterior of the enclosure.

12. The method of claim 11, wherein the adaptive airflow flapper assembly is coupled to the enclosure such that the adaptive airflow flapper assembly is further configured to, when removed from the chassis, open to the open position relative to the enclosure to allow airflow between the interior and the exterior of the enclosure.

13. The method of claim 11, wherein mechanically coupling the adaptive airflow flapper assembly to the enclosure comprises mechanically coupling the adaptive airflow flapper assembly to the enclosure via a plurality of spring bolts configured to mechanically couple the flapper to the enclosure and a plurality of springs, each spring mechanically coupled to a respective spring bolt and the enclosure, each spring having a spring force that biases the adaptive airflow flapper assembly in the closed position.

14. The method of claim 13, wherein mechanical interaction of the spring bolt with the second information handling resource module when the second information handling resource module is populated in the second chassis bay causes the spring force to be overcome and causes the adaptive airflow flapper assembly to open to the open position.

15. The method of claim 11, wherein the enclosure is configured to, when present in the chassis adjacent to the second chassis bay populated with the second information handling resource module, interact with a second adaptive airflow flapper assembly of the second information handling resource module to cause the second adaptive airflow flapper assembly to open to an open position allowing airflow between the respective interiors of the first information handling resource module and the second information handling resource module.

* * * * *